United States Patent
Pan et al.

(10) Patent No.: US 7,569,503 B2
(45) Date of Patent: Aug. 4, 2009

(54) CONTACT DOPING AND ANNEALING SYSTEMS AND PROCESSES FOR NANOWIRE THIN FILMS

(75) Inventors: Yaoling Pan, Union City, CA (US); David P. Stumbo, Belmont, CA (US)

(73) Assignee: Nanosys, Inc., Palo Alto, CA (US)

( * ) Notice: Subject to any disclaimer, the term of this patent is extended or adjusted under 35 U.S.C. 154(b) by 400 days.

(21) Appl. No.: 11/271,488

(22) Filed: Nov. 10, 2005

(65) Prior Publication Data

US 2006/0234519 A1  Oct. 19, 2006

Related U.S. Application Data

(60) Provisional application No. 60/630,743, filed on Nov. 24, 2004.

(51) Int. Cl.
*H01L 21/00* (2006.01)
(52) U.S. Cl. ............... 438/795; 438/799; 257/E21.471; 257/E21.475; 977/901; 977/963
(58) Field of Classification Search .......... 438/795, 438/799, 659, 535; 977/762, 901, 963, 707; 257/E21.471, E21.475, E21.328
See application file for complete search history.

(56) References Cited

U.S. PATENT DOCUMENTS

| | | | |
|---|---|---|---|
| 4,949,348 A | | 8/1990 | Nguyen et al. |
| 4,988,879 A | * | 1/1991 | Zare et al. ............... 250/423 P |
| 5,731,046 A | * | 3/1998 | Mistry et al. ............ 427/553 |
| 5,920,078 A | | 7/1999 | Frey |
| 5,962,863 A | | 10/1999 | Russell et al. |
| 6,256,767 B1 | | 7/2001 | Kuekes et al. |
| 6,274,007 B1 | | 8/2001 | Smirnov et al. |
| 6,438,025 B1 | | 8/2002 | Skarupo |
| 6,447,663 B1 | | 9/2002 | Lee et al. |
| 6,458,430 B1 | | 10/2002 | Bernstein et al. |
| 6,465,813 B2 | | 10/2002 | Ihm |
| 6,489,589 B1 | * | 12/2002 | Alexander ............. 219/121.69 |
| 6,566,704 B2 | | 5/2003 | Choi et al. |

(Continued)

FOREIGN PATENT DOCUMENTS

| WO | WO-0103208 | 1/2001 |
|---|---|---|
| WO | WO-0217362 | 2/2002 |
| WO | WO-0248701 | 6/2002 |

OTHER PUBLICATIONS

Chung, S-W et al., "Silicon nanowire devices" Am. Inst. Phys. (2000) 76(15):2068-2070.

(Continued)

*Primary Examiner*—Caridad M Everhart
(74) *Attorney, Agent, or Firm*—Andrew L. Filler

(57) ABSTRACT

Embodiments of the present invention are provided for improved contact doping and annealing systems and processes. In embodiments, a plasma ion immersion implantation (PIII) process is used for contact doping of nanowires and other nanoelement based thin film devices. According to further embodiments of the present invention, pulsed laser annealing using laser energy at relatively low laser fluences below about 100 mJ/cm$^2$ (e.g., less than about 50 mJ/cm$^2$, e.g., between about 2 and 18 mJ/cm$^2$) is used to anneal nanowire and other nanoelement-based devices on substrates, such as low temperature flexible substrates, e.g., plastic substrates.

44 Claims, 7 Drawing Sheets

U.S. PATENT DOCUMENTS

| | | |
|---|---|---|
| 6,586,785 B2 | 7/2003 | Flagan et al. |
| 6,672,925 B2 | 1/2004 | Talin et al. |
| 6,706,566 B2 | 3/2004 | Avouris et al. |
| 6,760,245 B2 | 7/2004 | Eaton et al. |
| 6,790,425 B1 | 9/2004 | Smalley et al. |
| 6,798,000 B2 | 9/2004 | Luyken et al. |
| 6,815,218 B1 | 11/2004 | Jacobson et al. |
| 6,872,645 B2 | 3/2005 | Duan et al. |
| 6,878,417 B2 * | 4/2005 | Polanyi et al. ............... 427/533 |
| 6,882,051 B2 | 4/2005 | Majumdar et al. |
| 6,903,717 B2 | 6/2005 | Takahashi et al. |
| 2002/0117659 A1 | 8/2002 | Lieber et al. |
| 2002/0127495 A1 | 9/2002 | Scherer |
| 2002/0130311 A1 * | 9/2002 | Lieber et al. .................... 257/1 |
| 2002/0130353 A1 | 9/2002 | Lieber et al. |
| 2002/0163079 A1 | 11/2002 | Awano |
| 2002/0173083 A1 | 11/2002 | Avouris et al. |
| 2002/0175408 A1 | 11/2002 | Majumdar et al. |
| 2003/0012723 A1 | 1/2003 | Clarke |
| 2003/0042562 A1 | 3/2003 | Giebeler et al. |
| 2003/0089899 A1 | 5/2003 | Lieber et al. |
| 2003/0186522 A1 | 10/2003 | Duan et al. |
| 2003/0189202 A1 | 10/2003 | Li et al. |
| 2003/0226820 A1 * | 12/2003 | Khang ......................... 216/54 |
| 2004/0005258 A1 * | 1/2004 | Fonash et al. ............... 422/271 |
| 2004/0031975 A1 | 2/2004 | Kern et al. |
| 2004/0036126 A1 | 2/2004 | Chau et al. |
| 2004/0036128 A1 | 2/2004 | Zhang et al. |
| 2004/0061422 A1 | 4/2004 | Avouris et al. |
| 2004/0079195 A1 * | 4/2004 | Perry et al. .................... 75/345 |
| 2004/0147070 A1 * | 7/2004 | Lei et al. ..................... 438/199 |
| 2004/0213307 A1 | 10/2004 | Lieber et al. |
| 2004/0238887 A1 | 12/2004 | Nihey |
| 2005/0064618 A1 | 3/2005 | Brown et al. |
| 2005/0079659 A1 | 4/2005 | Duan et al. |
| 2005/0224360 A1 * | 10/2005 | Varghese et al. ............ 205/171 |
| 2006/0008942 A1 | 1/2006 | Romano et al. |
| 2006/0009003 A1 | 1/2006 | Romano et al. |
| 2006/0063361 A1 * | 3/2006 | Kumar et al. ................ 438/513 |
| 2007/0119546 A1 * | 5/2007 | Collins et al. .......... 156/345.48 |
| 2008/0132041 A1 * | 6/2008 | Yamazaki et al. ............ 438/487 |
| 2008/0176349 A1 * | 7/2008 | Suh et al. ...................... 438/34 |

OTHER PUBLICATIONS

Duan, X. et al., "High performance thin-film transistors using semiconductor nanowires and nanoribbons" Nature (2003) 425:274-278.

Tans, S.J. et al., "Room-temperature transistor based on a single carbon nanotube" Nature (1998) 393:49-52.

Yamada, T. "Analysis of submicron carbon nanotube field-effect transistors" Appl. Phys Letts (2000) 76(5):628-630.

* cited by examiner

100

```
┌─────────────────────────────────────────────────┐
│ Nanowires are synthesized at high temperature   │— 102
└─────────────────────────────────────────────────┘
                         │
                         ▼
┌─────────────────────────────────────────────────┐
│ Thermal oxidation is performed to grow a thin   │— 104
│ oxide shell layer conformally around the nanowire│
└─────────────────────────────────────────────────┘
                         │
                         ▼
┌─────────────────────────────────────────────────┐— 106
│ The nanowires are transferred to a substrate to form a uniform thin film │
└─────────────────────────────────────────────────┘
                         │
                         ▼
┌─────────────────────┐
│ A gate is formed    │— 108
└─────────────────────┘
                         │
                         ▼
┌─────────────────────────────────────────────────┐— 110
│ A blank ion implantation is carried out to dope the gate and contact regions │
└─────────────────────────────────────────────────┘
                         │
                         ▼
┌─────────────────────────────────────────────────┐— 112
│ A thermal annealing process is used to activate the dopant as well as to recrystallize the │
│ nanowire lattice structure to remove crystal damage caused during ion implantation │
└─────────────────────────────────────────────────┘
                         │
                         ▼
┌─────────────────────────────────────────────────┐— 114
│ A dielectric film deposition process is performed to passivate the device │
└─────────────────────────────────────────────────┘
                         │
                         ▼
┌─────────────────────────────────────────────────┐— 116
│ A via formation process is performed to open the contacts │
└─────────────────────────────────────────────────┘
                         │
                         ▼
┌─────────────────────────────────────────────────┐— 118
│ A metallization process is performed to form interconnects │
└─────────────────────────────────────────────────┘
```

FIG. 1

# CONTACT DOPING AND ANNEALING SYSTEMS AND PROCESSES FOR NANOWIRE THIN FILMS

CROSS-REFERENCE TO RELATED APPLICATIONS

This application claims the benefit of U.S. Provisional Patent Application No. 60/630,743, filed Nov. 24, 2004, which is incorporated in its entirety herein. This application is also related to co-pending and commonly assigned U.S. patent application Ser. No. 10/674,060, titled "Large-Area Nanoenabled Macroelectronic Substrates And Uses Therefor", filed Sep. 30, 2003, the entire contents of which are incorporated by reference herein.

STATEMENT REGARDING FEDERALLY SPONSORED RESEARCH

Not applicable.

FIELD OF THE INVENTION

The present invention relates generally to the fabrication of nanoscale field effect transistors, and more particularly, to improved contact doping and annealing systems and processes for nanowire thin films used in, e.g., thin film transistors for various electronic applications.

BACKGROUND OF THE INVENTION

The advancement of electronics has been moving towards two extremes in terms of physical scale. Rapid miniaturization of microelectronics according to Moore's law has led to remarkable increases in computing power while at the same time enabling reductions in cost. In parallel, extraordinary progress has been made in the other, relatively less noticed, area of macroelectronics, where electronic devices are integrated over large area substrates with sizes measured in square meters. Current macroelectronics are primarily based on amorphous silicon (a-Si) or polycrystalline silicon (poly-Si) thin film transistors (TFTs) on glass, and are finding important applications in areas, including flat panel display (FPD), solar cells, radiofrequency identification tags (RFIDs), image sensor arrays and digital x-ray imagers.

While the current technology is successful in many perspectives, it is limited in what applications it can address. For example, there has been growing interest in the use of plastic as the substrate for macroelectronics due to plastic's light weight, flexibility, shock resistance and low cost. However, the fabrication of high performance TFTs on plastics has been extremely challenging because all process steps must be carried out below the glass transition temperature of the plastic. Significant efforts have been devoted to search for new materials (such as organics and organic-inorganic hybrids) or new fabrication strategies suitable for TFTs on plastics, but only with limited success. Organic TFTs promise the potential of roll-to-roll fabrication process on plastic substrates, but with only a limited carrier mobility of about 1 $cm^2/V \cdot s$. The limitations posed by materials and/or substrate process temperature (particularly on plastic) lead to low device performance, restricting devices to low-frequency applications. Therefore, applications that require even modest computation, control, or communication functions cannot be addressed by the existing TFT technology.

Individual semiconductor nanowires (NWs) and single walled carbon nanotubes can be used to fabricate nanoscale field effect transistors (FETs) with electronic performance comparable to and in some case exceeding that of the highest-quality single-crystal materials. In particular, carrier mobility of 300 $cm^2/V \cdot s$ has been demonstrated for p-Si NWs, 2000-4000 $cm^2/V \cdot s$ for n-indium InP NWs and up to 20,000 $cm^2/V \cdot s$ for single walled carbon nanotubes. These nanoFETs promise to push Moore's law to the ultimate limit—molecular level—with unprecedented performance.

Critical to the fabrication of nanoscale TFTs that can be applied to glass, plastics and other substrates requiring low process temperatures is a contact doping and annealing process to implant dopant ions into nanowires and to activate the dopant in the source and drain contact regions of the nanowires and to recover any crystal damage due to ion implantation. Plasma immersion ion implantation (PII) is a large-area and high-throughput doping tool, having many inherent advantages over conventional beam ion implantation. When introduced in the late 1980's, the technique was primarily used to enhance the surface mechanical properties of metals. More recently, the technique has been used for semiconductor processing, including formation of ultra-shallow junctions, selective metal deposition, synthesis of silicon-on-insulator substrates (SIMOX and Ion-Cut), hydrogenation of poly-Si TFTs, and for high aspect ratio trench doping. However, PIII has not to the knowledge of the present inventors been applied to the contact doping of TFTs based on nanowire thin films.

In addition, pulsed laser annealing (PLA) processes have been used in the fabrication of a-Si and poly-Si TFTs for active-matrix liquid-crystal display (AMLCD) applications. Pulsed lasers provide rapid heating and cooling of the a-Si and poly-Si films, without causing the underlying substrate to melt. In comparison to PLA, conventional furnace annealing tends to be very slow, has a high thermal budget, and is not compatible with plastic substrates. Alternatively, very rapid thermal annealing (VRTA) processes involve heating periods of the order of 1 second, and require high peak temperatures that are incompatible with low temperature substrates (for example, glass or plastic substrates). In contrast, PLA can yield TFT performance far superior to that achieved by furnace annealing and VRTA.

Rare-gas halogen excimer lasers have typically been used in conventional pulsed laser annealing processes for a-Si and poly-Si films because of their short wavelength in the UV band, and their ability to produce short high-intensity pulses. ArF (193 nm), KrF (248 nm), and XeCl (308 nm) are the gas mixtures most commonly used in these lasers for laser crystallization and annealing of a-Si and poly-Si thin films. Using lasers in the short wavelength (e.g., UV band) is advantageous for a-Si and poly-Si films because these films are highly absorptive in the UV, whereas most glass substrates are not. However, the use of shorter wavelength lasers (e.g., those which emit in the UV light range) is problematic when used with other substrates, such as polymers or plastics, which absorb highly in the UV range and can be thermally damaged (e.g., melt) when exposed to deep UV laser excitation.

The laser fluence also plays an important role in the uniformity of the resulting film following pulsed laser annealing. Typically, conventional laser annealing of a-Si and poly-Si films requires laser fluences on the order of about 250 $mJ/cm^2$ or higher. At laser fluences below about 100 $mJ/cm^2$, for example, the surface of a-Si and poly-Si films is not even melted, and some heating of the films is all that occurs. However, the thermal impact of such high laser fluences again can cause damage to the underlying low temperature substrate material.

Surprisingly, the inventor(s) of the present application have discovered that the melting threshold of nanowires is much lower than that for bulk Si, e.g., a-Si or poly-Si films, which indicates that nanowires (e.g., incorporated in NW thin films) used in NW-TFTs can be effectively doped and annealed using PIII followed by pulsed laser annealing at low laser fluences (e.g., laser fluences less than about 100 mJ/cm$^2$, for example, less than about 50 mJ/cm$^2$, for example, less than about 20 mJ/cm$^2$, e.g., between about 2 to 18 mJ/cm$^2$). Thus, such laser annealing can advantageously be performed using, for example, relatively long wavelength lasers (e.g., using Nd:YAG or Nd:YLF lasers having wavelengths greater than about 400 nm, e.g., greater than about 500 nm, for example) which are compatible with plastic substrates, and/or shorter wavelength lasers (e.g., excimer lasers) at low power settings, thus avoiding the deep thermal impact of UV absorption in polymer (and other low melting point) substrates. Using such PIII doping and pulsed laser annealing techniques, low resistance Ohmic contacts on nanowire transistors can be created (e.g., leading to improved transconductance and/or contact resistance) without using expensive conventional ion implantation and thermal annealing processes which can cause thermal damage to the underlying low temperature (e.g., plastic) substrates.

BRIEF SUMMARY OF THE INVENTION

According to embodiments of the present invention, plasma ion implantation immersion (PIII) is used to dope nanowire and other nanoelement-based devices on substrates. For example, a method for doping portions of at least one nanowire on a specimen is disclosed which generally comprises: enclosing the specimen in a chamber, wherein the specimen includes at least one nanowire thereon having at least one exposed portion; coupling an electrical potential to the specimen; and sourcing a plasma into the chamber, the plasma including ions of a doping material; whereby the ions from the plasma implant the at least one exposed portion of the at least one nanowire. The specimen may include, for example, a flexible plastic substrate (or other low temperature substrate) that has a thin film of nanowires deposited thereon, whereby the PIII contact doping can be used, for example, to form drain and source contact regions in the thin film of nanowires.

According to other aspects of the present invention, a method for annealing at least one nanowire on a specimen is disclosed which generally comprises irradiating regions (e.g., doped source and drain regions) of the at least one nanowire (e.g., incorporated in a thin film of nanowires) on the specimen with a laser fluence of less than about 100 mJ/cm$^2$, e.g., less than about 50 mJ/cm$^2$, e.g., less than about 20 mJ/cm$^2$. Because the laser fluence required to melt the nanowires is so low, advantageously the laser annealing can be performed using longer wavelength lasers such as a pulsed Nd:YLF (neodymium: yttrium lithium fluoride) laser or a Nd:YAG (neodymium: yttrium aluminum garnate) laser which emit visible light at wavelengths that are not readily absorbed by low-temperature (e.g., plastic) substrates (thus avoiding deep thermal impact), which lasers are readily commercially available, are relatively inexpensive, and are readily integrated into the nanowire device fabrication process flow. In addition, the laser annealing can also be performed with shorter wavelength lasers such as an excimer laser—despite the fact that plastic substrates are highly absorptive at lower wavelengths (e.g., in the UV light range)—because the laser fluence required to anneal the nanowires without melting the nanowires is low enough so as not to cause significant thermal damage to the underlying substrate. The laser preferably has a laser fluence of between about 2 and 18 mJ/cm$^2$, for example, between about 6 and 14 mJ/cm$^2$, e.g., to activate dopant ions in selected regions of the nanowire (e.g., source and drain regions) and/or to recover crystal damage in the nanowire following PIII ion implantation, without melting the nanowire (or the underlying substrate). The annealing may be used as part of a dopant activation process in fabricating a semiconductor device such as a transistor, a diode, a resistor and the like.

The regions of the at least one nanowire which are irradiated with laser energy may comprise source and drain regions, for example, or may comprise one or more gate regions. The at least one nanowire may be incorporated in a thin film of nanowires which is deposited (e.g., from solution) on the specimen. The at least one nanowire may comprise a core and at least one shell layer disposed about the core such as a native or deposited oxide layer. Selected portions of the at least one shell layer at the ends of the nanowire may be removed (e.g., by etching) at the source and drain regions to make metal contacts (or other suitable electrical contacts) to the at least one nanowire core.

The dopant ions may be implanted, for example, using plasma immersion ion implantation to implant dopant ions into the at least one nanowire prior to irradiating the specimen with laser energy. The method may optionally comprise irradiating selected regions of the nanowire with at least a second laser, such as an Ar laser, wherein the first laser causes nucleation of a semiconductor material of the nanowire, and the second laser maintains a temperature of the nanowire to repair any damage to the nanowire caused during the doping process. The specimen may comprise a low melting point material such as a glass or plastic substrate that is substantially transparent to the annealing laser, whereby the laser emits light of a wavelength that is not substantially absorbed by the specimen.

In a related aspect of the invention, a method for annealing at least one nanowire on a specimen is disclosed which generally comprises emitting a laser beam at regions (e.g., doped regions) of the at least one nanowire on the specimen to cause annealing of the at least one nanowire, wherein the laser beam has a wavelength in the visible light range. The method may comprise pulsing the laser beam to cause the annealing of the doped regions. The laser beam may be emitted from a laser source selected from the group comprising a Nd:YLF (neodymium: yttrium lithium fluoride) laser source or a Nd:YAG (neodymium: yttrium aluminum garnate) laser source (or other suitable long wavelength laser source). The laser beam preferably has a fluence of less than about 100 mJ/cm$^2$, e.g., less than about 50 mJ/cm$^2$, e.g., less than about 20 mJ/cm$^2$, e.g., between about 2 and 18 mJ/cm$^2$, e.g., between about 6 and 14 mJ/cm$^2$.

In another aspect of the present invention, a method of making a field effect transistor on an active device area of a device substrate is disclosed, which generally comprises: depositing on a device substrate at least one nanowire; implanting dopant ions into at least source and drain regions of the at least one nanowire to form source and drain contact junctions; and performing a laser thermal anneal with a pulsed laser having a fluence of less than about 100 mJ/cm$^2$ to activate the dopant ions within the source and drain contact junctions. The pulsed laser may be selected, for example, from the group comprising a Nd:YLF (neodymium: yttrium lithium fluoride) laser, a Nd:YAG (neodymium: yttrium aluminum garnate) laser, or an excimer laser (such as a KrF laser). The pulsed laser preferably has a fluence of less than about 100 mJ/cm$^2$, e.g., less than about 50 mJ/cm$^2$, e.g., less than about 20 mJ/cm$^2$, e.g., between about 2 and 18 mJ/cm$^2$, e.g., between about 6 and 14 mJ/cm$^2$. The step of implanting dopant ions may comprise, for example, using plasma immersion ion implantation to implant the dopant ions.

In another aspect of the present invention, a system is disclosed which generally comprises: a substrate comprising at least one nanowire deposited thereon; at least a first laser source that emits a laser beam with a fluence of less than about 100 mJ/cm$^2$ to doped regions of the at least one nanowire on the substrate; and wherein the laser beam is pulsed to cause annealing of the doped regions. The system may further comprise a second laser source that emits a second laser beam at the doped regions. The doped regions may include a source and a drain region of the at least one nanowire, or one or more gate regions. The substrate may further comprise an optical buffer layer (e.g., which is substantially transparent to visible light) deposited on the substrate underlying the at least one nanowire, and a thermal buffer layer deposited above or below the optical buffer layer. The thermal buffer layer acts as a thermal buffer to dissipate any heat from the optical buffer layer to reduce the surface temperature of the substrate. The at least one nanowire may be incorporated within a thin film of nanowires which is deposited on the substrate.

Further embodiments, features, and advantages of the invention, as well as the structure and operation of the various embodiments of the invention are described in detail below with reference to accompanying drawings.

BRIEF DESCRIPTION OF THE DRAWINGS

FIG. 1 shows example conventional steps for fabricating nanowire thin film transistor devices.

FIG. 4A is a graph showing nanowire resistances at various laser fluences using excimer laser annealing; FIG. 4B is a graph showing nanowire resistance versus number of pulses of laser energy using excimer laser annealing.

DETAILED DESCRIPTION OF THE INVENTION

Figure 2:
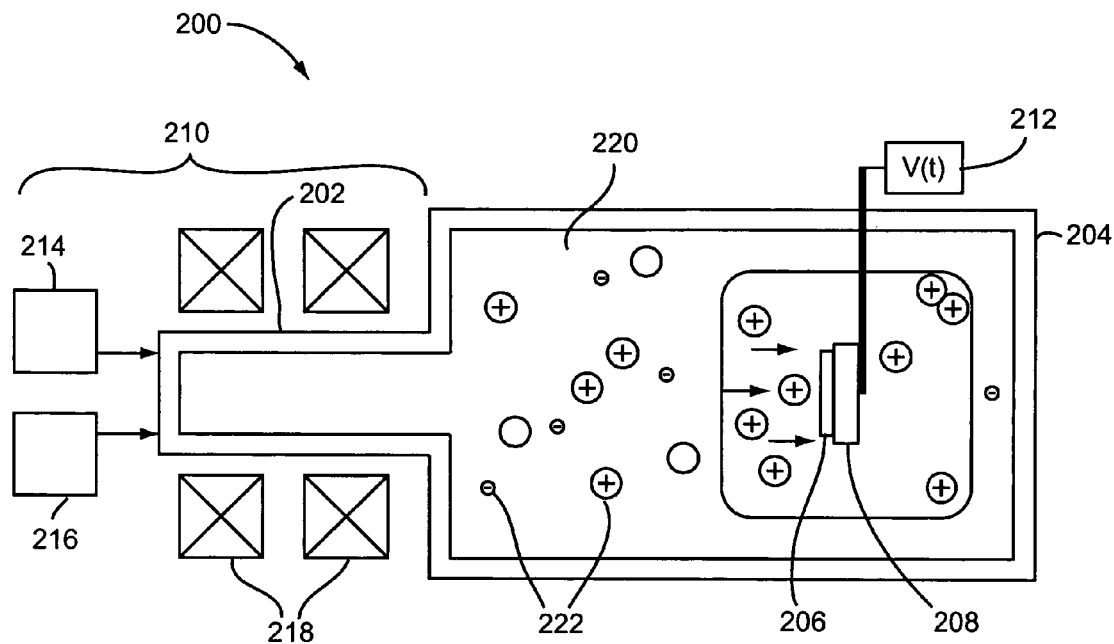
FIG. 2 shows an example of a system 200 for performing plasma ion immersion implantation (PIII), according to an embodiment of the present invention.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanotube, nanorod, nanowire and nanoribbon technologies and other functional aspects of the systems (and components of the individual operating components of the systems) may not be described in detail herein. Furthermore, for purposes of brevity, the invention is frequently described herein as pertaining to a semiconductor transistor device including nanowires. However, the present invention is not limited to nanowires, and other nanostructures such as nanotubes, nanorods, nanowhiskers, nanoribbons and the like may be used. Moreover, while the number of nanowires and spacing of those nanowires are provided for the specific implementations discussed, the implementations are not intended to be limiting and a wide range of the number of nanowires and spacing can also be used. It should be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, the term "nanowire" generally refers to any elongated conductive or semiconductive material that includes at least one cross sectional dimension that is less than 500 nm, and preferably, less than 100 nm, and has an aspect ratio (length:width) of greater than 10, preferably, greater than 50, and more preferably, greater than 100. Examples of such nanowires include semiconductor nanowires as described in Published International Patent Application Nos. WO 02/17362, WO 02/48701, and 01/03208, carbon nanotubes, and other elongated conductive or semiconductive structures of like dimensions.

While the example implementations described herein principally use Si, other types of nanowires (and other nanostructures such as nanoribbons, nanotubes, nanorods and the like) can be used including semiconductive nanowires, that are comprised of semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, CaCN2, ZnGeP2, CdSnAs2, ZnSnSb2, CuGeP3, CuSi2P3, (Cu, Ag)(Al, Ga, In, Tl, Fe)(S, Se, Te) 2, Si3N4, Ge3N4, Al$_2$O$_3$, (Al, Ga, In) 2 (S, Se, Te) 3, Al2CO, and an appropriate combination of two or more such semiconductors.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type is selected from a group consisting of: Si, Ge, Sn, S, Se and Te.

Additionally, the nanowires can include carbon nanotubes, or conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes. Nanotubes can be formed in combinations/thin films of nanotubes as is described herein for nanowires, alone or in combination with nanowires, to provide the properties and advantages described herein.

Furthermore, it is noted that thin film of nanowires of the present invention can be a "heterogeneous" film, which incorporates semiconductor nanowires and/or nanotubes, and/or any combination thereof of different composition and/or structural characteristics. For example, a "heterogeneous film" can includes nanowires/nanotubes with varying diameters and lengths, and nanowires and/or nanotubes that are "heterostructures" having varying characteristics including core-shell nanowire/nanotube structures and nanowires/nanotubes having different compositions along the length of the nanowire/nanotube as is described, for example, in U.S. patent application Ser. No. 10/112,578 entitled "Methods of Fabricating Nanostructures and Nanowires and Devices Fabricated Therefrom," filed Mar. 29, 2002, the entire contents of which are incorporated by reference herein.

In the context of the invention, although the focus of the detailed description relates to use of nanowire thin films on plastic substrates, the substrate to which nanowires are attached may comprise other materials, including, but not limited to: a uniform substrate, e.g., a substrate of solid material, such as silicon, glass, quartz, polymerics, etc.; a large rigid sheet of solid materials, e.g., glass, quartz, plastics such as polycarbonate, polystyrene, etc., or can comprise additional elements, e.g., structural, compositional, etc. A flexible substrate, such as a roll of plastic such as polyolefins, polyamide, and others, a transparent substrate, or combinations of these features can be employed. In addition, the substrate may include other circuit or structural elements that are part of the ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

By substantially "aligned" or "oriented" is meant that the longitudinal axes of a majority of nanowires in a collection or population of nanowires is oriented within 30 degrees of a single direction. Although the majority can be considered to be a number of nanowires greater than 50%, in various embodiments, 60%, 75%, 80%, 90%, or other percentage of nanowires can be considered to be a majority that are so oriented. In certain preferred aspects, the majority of nanowires are oriented within 10 degrees of the desired direction. In additional embodiments, the majority of nanowires may be oriented within other numbers or ranges of degrees of the desired direction.

It should be understood that the spatial descriptions (e.g., "above", "below", "up", "down", "top", "bottom", etc.) made herein are for purposes of illustration only, and that devices of the present invention can be spatially arranged in any orientation or manner.

I. Embodiments for Improved Contact Doping and Annealing

Embodiments of the present invention are provided for improved contact doping and annealing systems and processes. These embodiments are provided for illustrative purposes, and are not limiting. Additional operational and structural embodiments for the present invention will be apparent to persons skilled in the relevant art(s) from the description herein. These additional embodiments are within the scope and spirit of the present invention.

Co-pending and commonly assigned U.S. patent application Ser. No. 10/674,060, titled "Large-Area Nanoenabled Macroelectronic Substrates And Uses Therefor", filed Sep. 30, 2003 describes methods and systems for high-performance large-area thin-film electronics that provide the electronic performance of a silicon substrate, but can be processed over large areas, at low-temperature, on flexible plastic substrates. The substrates described therein incorporate thin films of semiconducting nanowires deposited therein and configured to operate as transistors. These thin film transistors can also be referred to as nanobundle transistors (NBTs).

These thin film transistors allow the use of conventional semiconductor processing, such as CMOS (complementary metal oxide semiconductor) processing, to enable the formation of high-performance, low power, large-area electronics at low temperature on flexible substrates—a true semiconductor-on-plastic technology. Example NBTs have performance characteristics such as: mobilities exceeding 100 cm$^2$/V-s, on-off current ratios greater than $10^6$, on-currents of 1 mA and threshold voltages less than 1 V at device operating voltages of less than 5 V.

While NBTs are compatible with processing at low temperature and over large areas on flexible substrates, their source and drain contacts are typically made using conventional ion beam and high temperature thermal annealing semiconductor processes. Such source and drain contact forming processes are incompatible with low-temperature flexible substrates for NBTs. This step is typically the only processing step requiring a high temperature, and thus is a primary barrier hindering the use of flexible plastic substrates. Thus, novel low-temperature processes for forming ohmic contacts to nanowires transistors are desired.

Flowchart 100 of FIG. 1 shows example conventional steps for fabricating NBT devices. The steps of flowchart 100 are briefly described as follows. In step 102, nanowires are synthesized at high temperature. For example, the nanowires may be made from any type of semiconductor material, including silicon. Furthermore, the nanowires can be single crystal, or other type. The nanowires can be synthesized/fabricated in any manner.

In step 104, thermal oxidation is performed to grow a thin oxide shell layer conformally around the nanowires In a transistor application, the shell layer serves as an integrated gate-dielectric. In step 106, the nanowires are transferred to a substrate to form a uniform thin film. For example, step 106 can be performed at room temperature, or other temperature. The nanowires can be aligned relative to each other, or non-aligned. The nanowires can be densely packed, or otherwise packed as required by the particular application. In step 108, a gate is formed. For example, step 108 can be performed at a low temperature (<100° C.), such as using by standard thin film deposition and lithography processes. In step 110, a blank ion implantation is carried out to dope the gate and contact regions (e.g., source and drain regions). In step 112, a thermal annealing process is used to activate the dopant as well as to recrystallize the nanowire lattice structure to remove crystal damage caused during ion implantation. In step 114, a dielectric film deposition process is performed to passivate the device. In step 116, a via formation process is performed to open the contacts. In step 118, a metallization process is performed to form interconnects, as needed.

The steps of flowchart 100, except for step 106 (nanowire deposition), use traditional TFT (thin film transistor) fabrication technology. This is a benefit of NBT technology. For example, in a silicon material embodiment, because the semiconductor nanowires are made of silicon and the gate dielectric is made of $SiO_2$, there is no need to change manufacturing processes. Using this process, NBTs with performance capabilities close to that of comparably doped crystal silicon MOS devices (e.g., transconductance of 0.75 µS/µm for p-MOS NBTs compared to 1.0 µS/µm for conventional p-MOS single crystal silicon devices) can be formed.

Having sufficient contacts to the source and drain regions of an NBT is fundamental to having desired device performance characteristics. For example, such desired characteristics include, for example, low series resistance and high transconductance. In conventional semiconductor processes, contact formation involves contact doping (e.g., step 110 of flowchart 100) followed by thermal annealing for recrystallization and dopant activation (e.g., step 114 of flowchart 100). Current methods for forming contacts in advanced semiconductor devices use low energy ion implantation and rapid thermal annealing. A low ion energy is necessary to control the dopant profile (i.e., a distribution of the dopant throughout the semiconductor) to allow for a very shallow junction formation (e.g., less than 50 nm). Rapid thermal annealing allows for a low thermal budget that minimizes the dopant diffusion, and allows for good junction profile control. In addition to these requirements for forming good contacts, in the case of nanowire macroelectronics, several additional factors are considered. These include:

Low ion energy is used for the formation of a shallow junction, and to control the dopant profile to avoid permanent damage of the lattice structure in the nanowire (as described above). For example, the dopant ions should not completely penetrate the nanowire(s) during ion implantation so that a portion of the underlying crystal structure is retained to facilitate recovery during re-crystallization.

Nanowires have a 3-dimensional structure. Conformal ion doping of nanowires is performed such that a uniform surface dopant is formed around the entire nanowire circumference. It is noted that conventional beam ion implantation typically results in inhomogeneous doping profiles because ions are implanted using a focused beam line, and thus it is difficult to uniformly dope a nanowire around its circumference using a beam.

It is desired to be able to apply the above-described techniques to large scale electronics applications, such as roll to roll processes. With current ion beam implantation method, there is an approximately linear process time dependence versus the size of the substrate. Thus, scaling to large substrates is not always economically viable.

A low process temperature is desirable for nanowire devices to be made on flexible, plastic substrates. Conventional semiconductor thermal processes (furnace annealing or rapid thermal processes) require high temperatures (e.g., greater than 500° C.) which is incompatible with plastic substrates.

Embodiments of the present invention overcome these above-described limitations. In embodiments, a plasma ion immersion implantation (PIII) process is used for contact doping. Furthermore, in embodiments, a pulsed laser annealing process (LAP) is used for recrystallization and dopant activation. These processes offer the following advantages, among others:

A low ion implantation energy (e.g., less than 5 kV, e.g., between about 1 and 2 kHz) at a duty cycle of between about 1 to 5 microseconds, e.g., between 1 to 3 microseconds, can be used. Thus, potential crystal structure damage to the nanowires can be better controlled. High dose rate implantation can be performed, for heavily and controllably doping the source/drain contacts for low contact and series resistances. A conformal doping profile can be achieved, for uniform surface carrier concentration in and around the nanowire. These processes are readily scalable to large format substrates, including roll to roll manufacturing processes. True low temperature processes can be achieved, enabling the use of flexible plastic substrates that cannot be processed in high temperature environments. Existing high density plasma systems can be leveraged for low cost system implementation.

These processes are CMOS technology compatible.

The following subsections describe in further detail example embodiments using a plasma ion immersion implantation (PIII) process for contact doping and a pulsed laser annealing process (LAP) for recrystallization and dopant activation. Additional operational and structural embodiments for the present invention will be apparent to persons skilled in the relevant art(s) from the description below.

a. Embodiments for Forming Contacts Using PIII

According to embodiments of the present invention, PIII is used to dope nanowire and other nanoelement-based devices on substrates. For example, PIII can be used in step 110 of flowchart 100, instead of conventional doping techniques. FIG. 2 shows a conventional PIII reactor system 200 which can be used for contact doping according to an embodiment of the present invention. System 200 includes a source chamber 202, a process chamber 204, a substrate holder 208, a plasma generator or source 210, and a voltage/potential source 212. Plasma source 210 of FIG. 2 generates plasma 220, having a high enough density and sufficiently high energy ions for sufficient dopant implantation of the desired regions of a substrate 206, without damaging substrate 206.

In the current example, plasma source 210 includes a microwave source 214, a gas source 216, and magnetic coils 218. For example, plasma source 210 can be a commercial, well-regulated 1500-Watt ECR (electron cyclotron resonance) 2.45 GHz microwave source. Gas source 216 provides the dopant material gas typically included with an inert gas. Microwave source 214 irradiates the gas into plasma form. For example, power can be coupled into a 6-inch diameter source chamber 202 using a TE10 rectangular to TM01 circular mode converter, which eliminates azimuthal plasma non-uniformity and provides increased radial uniformity over conventional coupling schemes. Other high density plasma instruments may also be used in practicing the PIII doping according to the methods of the present invention.

Plasma 220 expands from source chamber 202 into an 18-inch diameter, 30-inch long process chamber 204, where implantation takes place. Substrate 206 is implanted by plasma ions 222 generated in process chamber 204. Substrate 206 is held in chamber 204 by substrate holder 208, which is coupled to potential source 212. A substrate current (or charge per pulse) of ions 222 impacting substrate 206 can be monitored, such as by a Rogowski loop. Ion densities of $10^{10}$ to $10^{11}$/cm$^3$ can be achieved at substrate holder 208 with a microwave power of 1000 watts. In the current example, a maximum dose rate is an approximately $10^{11}$/cm$^2$-pulse, with pulse operation and $10^{16}$/cm$^2$-sec with DC operation.

Because of the absence of ion transport optics and mass selection, PIII is capable of providing a high ion flux. It is also a non-"line-of-sight" process, as opposed to conventional beam ion implantation. Thus, this enables homogenous conformal doping profiles of non-planar surfaces such as nanowires. For example, a nanowire may be uniformly doped around its circumference using this technique.

There are numerous advantages and beneficial properties of PIII. For example, PIII is not subject to normal thermodynamic constraints such as impurity solubility. The equipment used for PIII is similar to that of a plasma etcher or deposition, and is much simpler than beam ion implanters. The implantation flux can be relatively high. Multiple processes, such as simultaneous and consecutive implantation, deposition, and etching, are possible by varying the instrumental parameters.

As described above, a step in making contacts to nanowires during the fabrication of NBT devices is the source-drain doping of the nanowires to create p+/n (or other p/n doping level) junctions. The PIII process can be varied to form the source-drain regions of nanowire FETs with low parasitic resistance using PIII.

Planar MOSFET doping can form junctions as shallow as 10 nm to nanowires, for example. The nanowires present a non-planar surface (e.g. circular cross-section). In the case of PIII, implantation of ions occurs via a plasma, which by nature is inherently non-directional and will conform to a surface. In order to achieve doping control, the plasma gas pressure can be controlled to control the mean free path for ion-gas collision. This enables a randomization of the ion trajectories when the ions pick up kinetic energy traversing the plasma sheath. As a result, conformal implantation and doping profile uniformity across the wire depths after thermal treatment occurs. Alternatively, multiple bias waveforms can be used during the implant, to cause a variety of ion penetration depths. The resulting superposition of various ion penetration depths generates a more homogenous implantation profile across the nanowire cross-section.

In an example embodiment, a NBT device can incorporate a self-aligned or non-self-aligned poly-silicon gate. Using PIII, the processes for doping of both source/drain and gate can occur simultaneously. For a gate thickness of approximately 1000 Å or less, to achieve uniform doping across the poly-silicon layer, the ion penetration depth into the nanowires should be less than 500 Å in the contact areas. Control during the PIII process can be used to reduce or minimize parasitic effects, such as poly depletion. Furthermore, the grain structure of the poly-silicon gate can be controlled during the laser annealing processes to improve the doping efficiency to reduce the sheet resistance.

b. Embodiments for Laser Annealing Processes for Contact Regions

Pulsed laser annealing (PLA) processes have been used in the fabrication of poly-silicon thin film transistors (TFTs) for active-matrix liquid-crystal display (AMLCD) applications. In comparison to PLA, conventional furnace annealing tends to be very slow, has a high thermal budget, and is not compatible with plastic substrates. Alternatively, very rapid thermal annealing (VRTA) processes involve heating periods of the order of 1 second, and requires high peak temperatures that are incompatible with low temperature substrates (for example, glass or plastic substrates).

In contrast, PLA can yield TFT performance far superior to that achieved by furnace annealing and VRTA. According to embodiments of the present invention, PLA is used to anneal nanowire and other nanoelement-based devices on substrates. For example, PLA can be used in step 112 of flowchart 100, instead of conventional annealing techniques. Using PLA, high performance TFTs on plastic (or other material) substrates can be obtained.

With regard to doped nanowires, pulsed laser annealing or heating is used according to the present invention to recrystallize the nanowire material and activate the dopant distribution. After plasma ion implantation, damage to the semiconductor crystal structure occurs as the ions are incorporated into the lattice structure. Recrystallization includes moving atoms back into the proper atom sites, out of interstitial sites, to repair implantation damage caused during the doping process. Also, this process provides energy to drive solid-phase dopant activation, whereby the implanted ions chemically bond into lower energy interstitial sites of the semiconductor lattice for improving the electrical performance.

Thus, PLA is used to activate and repair damage to the source-drain contact regions of the NBTs caused during doping processes. In an embodiment, the high-mobility gate region of the NBT, which is not implanted during TFT fabrication, is already a perfect single crystal, and therefore does not require recrystallization. However, in alternative embodiments, PLA can be used to anneal gate regions.

The inventor(s) of the present application have made the surprising discovery that NW thin films used in NW-TFTs can be effectively annealed using laser annealing at lower laser fluences than for conventional bulk Si (e.g., a-Si or poly-Si), e.g., using laser fluences less than about 100 mJ/cm$^2$, for example, less than about 50 mJ/cm$^2$, e.g., less than about 20 mJ/cm$^2$, e.g., between about 2 to 16 mJ/cm$^2$ compared, thus avoiding the thermal impact of higher laser fluences in polymer (and other low melting point) substrates. Using such pulsed laser annealing techniques, low resistance Ohmic contacts on nanowire transistors can be created (e.g., leading to improved transconductance and/or contact resistance) without using conventional thermal annealing processes which require expensive laser equipment and which can cause thermal damage to the underlying low temperature substrates, e.g., by using longer wavelength lasers (e.g., Nd:YAG or Nd:YLF lasers etc. having wavelengths in the visible light range, e.g., wavelengths greater than about 400 nm, e.g., greater than about 500 nm) which are compatible with plastic substrates, and/or by using shorter wavelength lasers such as excimer lasers at lower power levels. Without being bound to a particular theory, it is believed that the laser fluence required for annealing nanowires is significantly lower than that for bulk silicon thin films (e.g., a-Si or poly-Si films) because the nanowires, due to their high surface to volume ratio, have a high thermal laser coupling efficiency in comparison to bulk based systems and good thermal confinement much like an adiabatic system.

Figure 3:
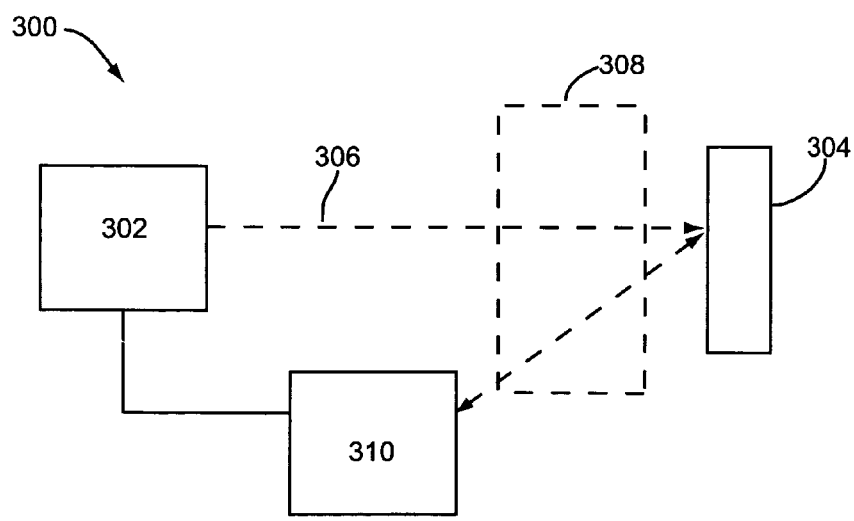
FIG. 3 shows an example pulsed laser annealing (PLA) system 300, according to an embodiment of the present invention.

FIG. 3 shows an example PLA system 300, according to an embodiment of the present invention. PLA system 300 includes a laser source 302. Laser source 302 directs a laser beam 306 at a target specimen 304, (such as a substrate or other substrate) and is pulsed to cause annealing of target specimen 304. For example laser source 302 is a Nd:YLF (neodymium: yttrium lithium fluoride) laser having a wavelength of about 524 nm, a Nd:YAG (neodymium: yttrium aluminum garnate) laser having a wavelength of about 532 nm, an excimer laser (e.g., a KrF laser having a wavelength of about 248 nm), or other suitable laser source. Optics 308 can optionally be present to aid in directing laser beam 306 to target specimen 304. Typically a short pulse duration is used, although longer pulse durations can be used in some applications.

When the pulse duration is short (e.g., less than 100 ns), the surface of target specimen 304 is not heated substantially. Because the temperature penetration depth in the surface is shallow (e.g., less than 0.1 µm), a thin buffer thermal isolation film can optionally be deposited on the target specimen substrate to prevent thermal degradation of the substrate. For example, the thermal isolation film can be deposited on the substrate prior to positioning nanowires (or other nanoelements) on the substrate. The thermal isolation film can be any isolating material, including alumna, silicon dioxide or other isolating material. Optionally, an optical buffer layer which is substantially transparent to visible light energy (e.g., BaTiO$_3$, MgO$_2$ etc.) may be deposited above or below the thermal isolation film to further help prevent thermal damage to the underlying substrate.

Note that an imaging device 310 may be present to aid laser source 302 in targeting specimen 304. For example, imaging device 310 may include a camera, charge coupled device (CCD), photodiodes, or other imaging device to capture an image specimen 304. Imaging device 310 can include a light source, such as a laser, to illuminate specimen 304 to create an image of specimen 304 to be captured. Imaging device 310 can include hardware, software, and/or firmware, including a processor, to process captured image information, and to provide/feedback location information to laser source 302. For example, a synchronized dye laser can be used to provide time-resolved imaging of the laser annealing process. A charge-coupled device (CCD) camera (not shown), or other image capturing device can receive the reflected light to generate positioning information. The positioning information can be generated by a computer coupled to the camera to provide target control.

Figure 4A:
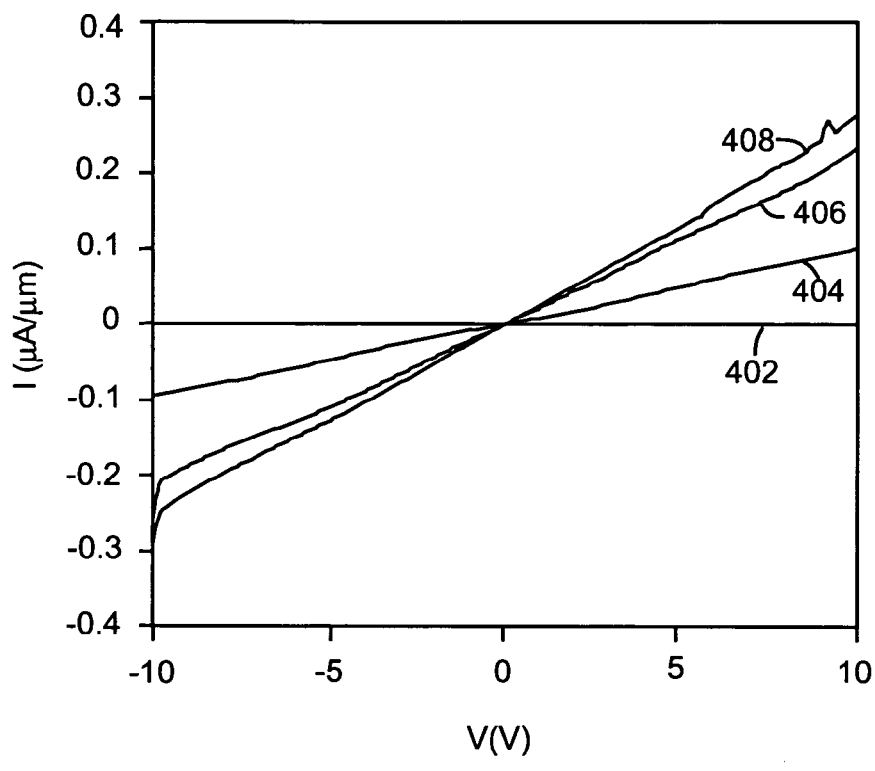
FIGS. 4A-B are graphs showing the use of excimer laser annealing for boron dopant activation in nanowires using low laser fluences at varying pulses.
Figure 4B:
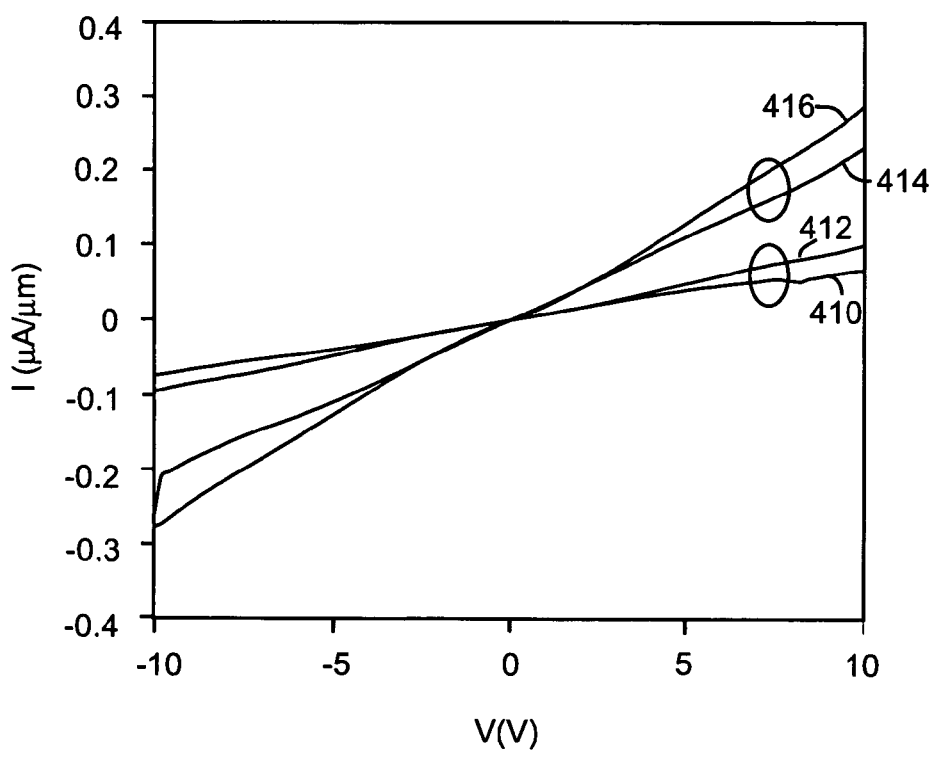

In the embodiment shown in FIGS. 4A-B, excimer laser annealing was used at various fluences of 7.6 mJ/cm² (reference numeral 402 in FIG. 4A), 11.1 mJ/cm² (reference numeral 406 in FIG. 4A), 12.5 mJ/cm² (reference numeral 404 in FIG. 4A), and 18.7 mJ/cm² (reference numeral 408 in FIG. 4A), and with varying numbers of pulses (e.g., reference numerals 412 and 414 in FIG. 4B show one pulse at a laser fluence of 12.5 and 11.1 mJ/cm², respectively; reference numerals 410 and 416 show five pulses at a laser fluence of 12.5 and 11.1 mJ/cm², respectively) to control boron dopant activation in sample nanowires with oxide shells (on the order of about 10 nm in thickness) on quartz substrates. With the proper laser fluence as shown, laser annealing clearly showed the dopant activation in nanowires without melting the nanowires. Even with a single laser pulse, the boron dopant activation level was sufficient for ohmic drain/source contact formation in the nanowires. However, increasing the number of pulses may be necessary to achieve desired low resistance contacts due to diffusion limited processes.

To control the extent of heating due to PLA, the quantity, spatial-profile, time-domain and distribution of energy applied to the nanowires can be varied within the ranges provided. For example, the time domain of the laser pulse energy can be controlled at the nanosecond and ultra-fast (i.e., femtosecond) scales. In the case of nanosecond time scales, energy deposition and temperature evolution are basically driven by thermal processes. However, the cooling rate is typically very fast (e.g., approximately $10^{10}$ K/s), thereby assisting the recrystallization process. In contrast, femtosecond laser energy coupling with the lattice will occur through energy deposition to the carrier system and subsequent collisional energy transfer to the lattice.

Since a nanowire has a non-planar geometry, laser energy coupling into the nanowire material will depend on the nanowire size, the wavelength (and thus the intrinsic absorption penetration depth), the nanowire composition (e.g., the intrinsic $SiO_2$ dielectric shell thickness) and the substrate properties. A nanowire scattering size parameter, $\chi$, is calculated as follows:

$$\chi = \pi D/\lambda,$$

where:
D=the nanowire diameter; and
λ=the laser light wavelength.

The wavelength, λ, is expected to be below 1 micron. Electromagnetic theory modeling based on the finite domain time difference (FDTD) method can be used to quantify the laser beam absorption in the nanowire. In an example embodiment, nanosecond laser pulses at visible wavelengths (e.g., λ=532 nm) can be used. The absorption penetration depth will be tens of nm for the visible wavelengths, which is comparable to the nanowire diameter. Controlling lateral diffusion and segregation of the dopant during laser annealing is desired. Rapid thermal annealing (RTA) processes are limited to low electrical activation due to the solid solubility and undesired dopant diffusion that make it very difficult for abrupt and shallow junction formation. Laser annealing can be used to form a steep junction profile. In laser annealing processes, the dopant diffusivities are approximately eight orders of magnitude higher in molten silicon than in solid silicon, which is useful to form a uniform abrupt dopant distribution profile across nanowires. However, because the dopant distribution is completely confined within the nanowire, the lateral dopant profile between contact and channel is less controlled and potentially can cause issues such as channel modulation from lateral dopant diffusion. To address this problem, the temperature can be controlled such that it will not be necessary to melt the nanowires while still being able to activate the dopant and remove crystal damage in the contact areas.

Laser activation annealing of the NBT devices at low laser fluences occurs locally, and is confined to the nanowires such that a low temperature plastic substrate will not be damaged. In addition to modifying the laser pulse parameters, a passivation layer (or layers) can be used on the nanowires to act as a thermal buffer (or barrier) to prevent the heat from directly transferring into the substrate. Additionally, the passivation layer can be selected such that it reduces the thermal stress induced at the interface between nanowire and passivation dielectric layer.

c. Example PIII and Laser Annealing Process Steps Embodiments

FIGS. 5A-G show example process steps for growing nanowires on a growth substrate, transferring the wires to a device substrate, and using PIII and pulsed laser annealing to form source and drain contact regions in the nanowires according to an embodiment of the invention. In an embodiment, and as shown first with reference to FIG. 5A, gold nanoparticles (not shown) with known diameters can be distributed on a silicon growth substrate 502 by deposition from solution followed by evaporation of the solvent by direct evaporation. After removing any leftover organic residue by one or more washing steps, the substrate substrate can be placed in a growth furnace to grow silicon nanowires 504. For example, $SiH_4$ or $SiCl_4$ can be used as the growth gases. By adjusting growth conditions, including growth gas concentration, temperature, and time, nanowires 504 up to 50 μm in length (or longer) can be obtained. A vapor etch using, e.g., hydrofluoric acid (HF) can then be used to remove native oxide from the nanowires, followed by growth of an integrated gate dielectric shell of oxide (e.g., $SiO_2$) 506 on the nanowires as shown, for example, in FIG. 5B.

Figure 5A:
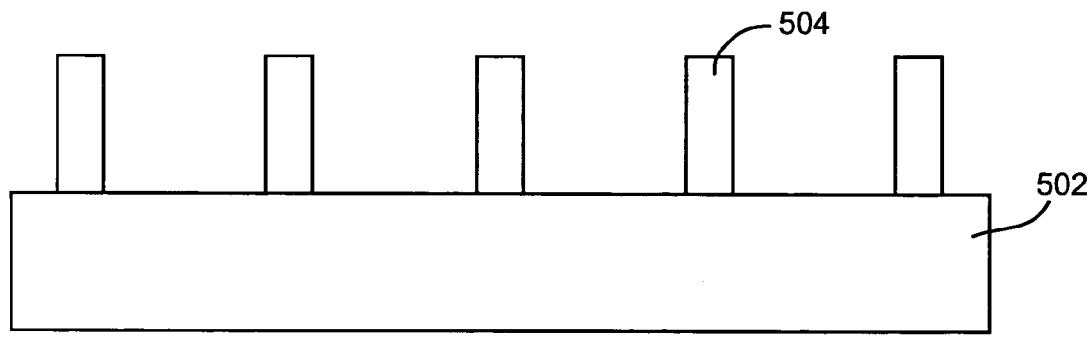
FIGS. 5A-G are schematics showing process steps for growing nanowires on a growth substrate, transferring the wires to a device substrate, and using PIII and pulsed laser annealing to form source and drain contact regions in the nanowires according to an embodiment of the invention.
Figure 5B:
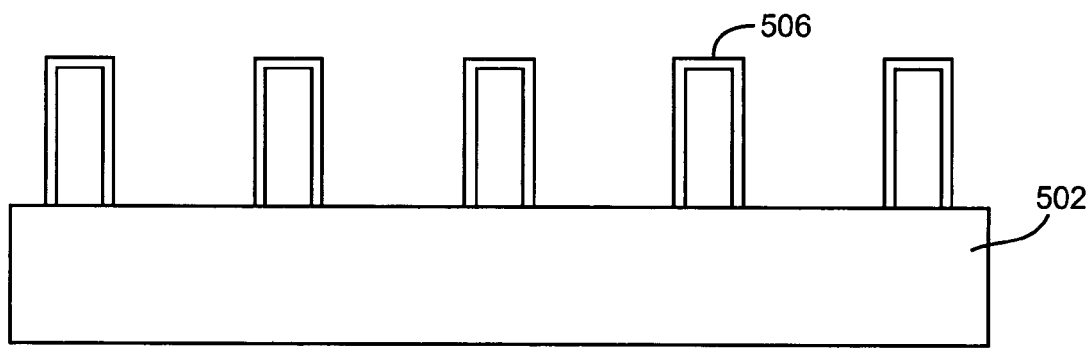
Figure 5C:
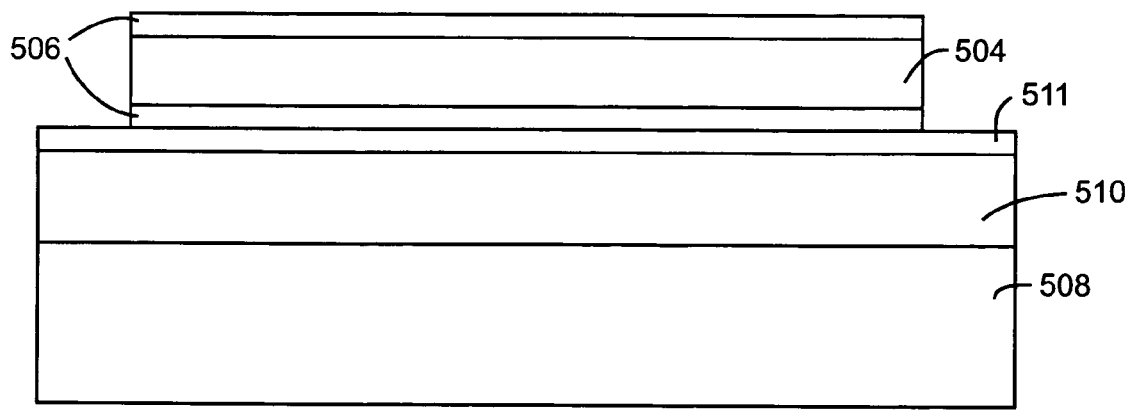

The resulting $Si/SiO_2$ core/shell nanowires 504 can be removed and deposited at ambient temperature on a device substrate 508 coated with an $SiO_2$ layer 510 (e.g., approximately 6000 Å thick) as shown in FIG. 5C (which only shows single nanowire 504 deposited thereon for clarity) and as described further below. Low temperature substrates such as glass, stainless steel or plastic laminated substrates can be coated with a dielectric layer 511 (for example, SiN) with a thickness of about 300-1000 Å by e-beam evaporation or sputtering deposition. The SiN layer serves as an intermediate layer to which the nanowires will adhere, and acts as a temporal thermal barrier for minimizing heat transfer into the substrate. One or more additional thermal buffer layers and/or optical buffer layers (e.g., $Al_2O_3$, $SiO_2$, MgO, $BaTiO_3$, etc.) (not shown) may also be formed on the dielectric layer 511, e.g., using thin film coating methods, to minimize laser energy absorption by the substrate (e.g., to prevent melting thereof). Where used, the optical buffer layer is preferably substantially transparent to visible light (e.g., has high optical absorption in the deep UV light range) with high heat capacity.

Nanowires 504 can be deposited (e.g., in a thin film of nanowires in solution) onto the substrate, and then TFT devices can be fabricated. Any type of thin film transistor device can be fabricated including, for example, flexible or rigid displays, radiofrequency identification tags, beamsteering antenna arrays, smart cards and the like. Collections of nanowires can be easily assembled onto any type of substrate from solution to achieve a thin film of nanowires. Aligned and non-aligned, and composite and non-composite thin films of nanowires can be produced in a variety of ways, according to the present invention. Randomly oriented thin films of nanowires can be obtained in a variety of ways. For example, nanowires can be dispersed into a suitable solution (e.g., ethanol or other solution). The nanowires can then be deposited onto a desired substrate using spin-casting, drop-and-dry, flood-and-dry, or dip-and-dry approaches. These processes can be undertaken multiple times to ensure a high degree of coverage. Randomly oriented thin films of nanowires/polymer composites can be produced in a similar way, providing that the solution in which the nanowires are dispersed is a polymer solution.

Aligned thin films of nanowires can be obtained in a variety of ways. For example, aligned thin films of nanowires can be produced by using the following techniques: (a) Langmuir-Blodgett film alignment; (b) fluidic flow approaches, such as described in U.S. Ser. No. 10/239,000, filed Sep. 10, 2002, Lieber et al. U.S. Patent Application Pub. No. U.S. 2002/0130311, filed Aug. 22, 2001 and in U.S. Ser. No. 60/605,454 entitled "Processes for Manufacturing, Harvesting and Integrating Nanowires into Functional Nanowire Based Devices," filed Aug. 30, 2004, the entire contents of which are each incorporated by reference herein; and (c) application of mechanical shear force (e.g., using a gravure coater). For example, mechanical shear force can be used by placing the nanowires between first and second surfaces, and then moving the first and second surfaces in opposite directions to align the nanowires. Aligned thin films of nanowires/polymer composites can be obtained using these techniques, followed by a spin-casting of the desired polymer onto the created thin film of nanowires. For example, nanowires may be deposited in a liquid polymer solution, alignment can then be performed according to one of these or other alignment processes, and the aligned nanowires can then be cured (e.g., UV cured, crosslinked, etc.). An aligned thin film of nanowires/polymer composite can also be obtained by mechanically stretching a randomly oriented thin film of nanowires/polymer composite.

The thin film of nanowires, when deposited on the substrate, can be used instead of amorphous silicon or organic thin films in conventional electronic devices to achieve improved device behavior, while allowing for a straight forward and inexpensive manufacturing process. Through the use of thin films of nanowires, the present invention is particularly adapted to making high performance, low cost devices on large and flexible substrates. The thin film of nanowires as described herein may be formed in a wide range of possible surface areas. For example, the thin films of nanowires of the present invention can be formed to have functional areas greater than 1 $mm^2$, greater than 1 $cm^2$, greater than 10 $cm^2$, greater than 1 $m^2$, and even greater or smaller areas.

The thin film of nanowires may include a plurality of individual nanowires closely located together. The thin film of nanowires can have a variety of thickness amounts that are equal to or greater than the thickness of a single nanowire. For example, the nanowires of thin film of nanowires are aligned such that their long axes are substantially parallel to each other. Note that in alternative embodiments, the nanowires of thin film of nanowires are not aligned, and instead can be oriented in different directions with respect to each other, either randomly or otherwise. In an alternative embodiment, the nanowires of the thin film of nanowires may be isotropically oriented, so that high mobility is provided in all directions. Note that the nanowires of thin film of nanowires may be aligned in any manner relative to the direction of electron flow in order to enhance performance as required by a particular application.

In the embodiments described herein, the nanowire(s) 504 of thin film of nanowires are single crystal semiconductor nanowires that span all the way between source electrode 524 and drain electrode 522 (e.g., see FIG. 5G) as described further below. The thin film of nanowires can be formed with a sufficient number of nanowires to provide desired characteristics for the semiconductor device (e.g., resistor, transistor, diode etc.) formed therefrom. For example, the thin film of nanowires can be formed of a sufficient number of nanowires to achieve a desired current density or current level desired for the particular semiconductor device. For instance, in the transistor example of FIGS. 5A-G described herein, the thin film of nanowires can be formed to have a current level in the channel of greater than about 2 nanoamps, e.g., greater than about 10 nanoamps.

In an embodiment, a thin film of nanowires can be formed to have asymmetric mobility. For example, this can be accomplished by asymmetrically aligning the nanowires of the thin film of nanowires, and/or by doping the nanowires in a particular manner. Such asymmetric mobility can be caused to be much greater in a first direction than in a second direction. For example, asymmetric mobilities can be created on the order of 10, 100, 1000, and 10000 times greater in the first direction than in the second direction, or to have any other asymmetric mobility ratio between, greater, or less than these values.

Figure 5D:
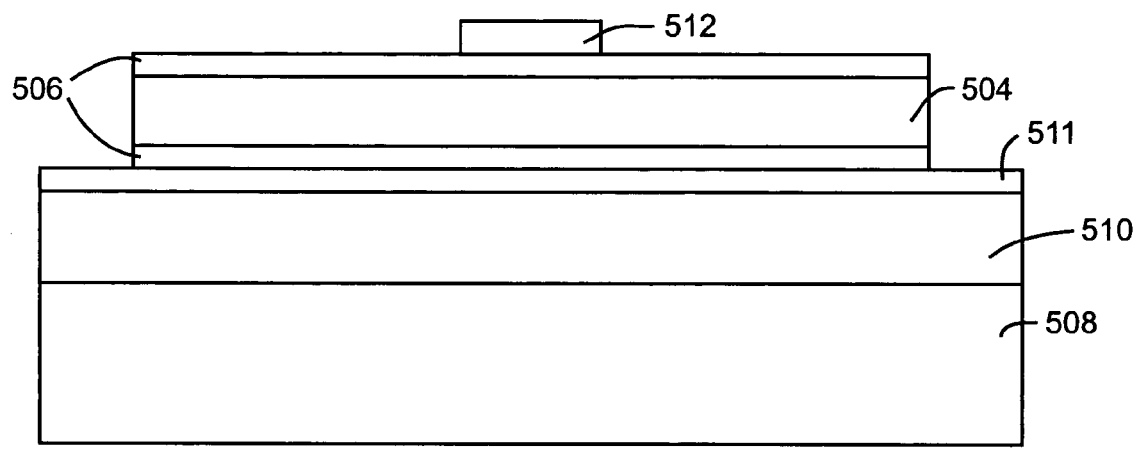
Figure 5E:
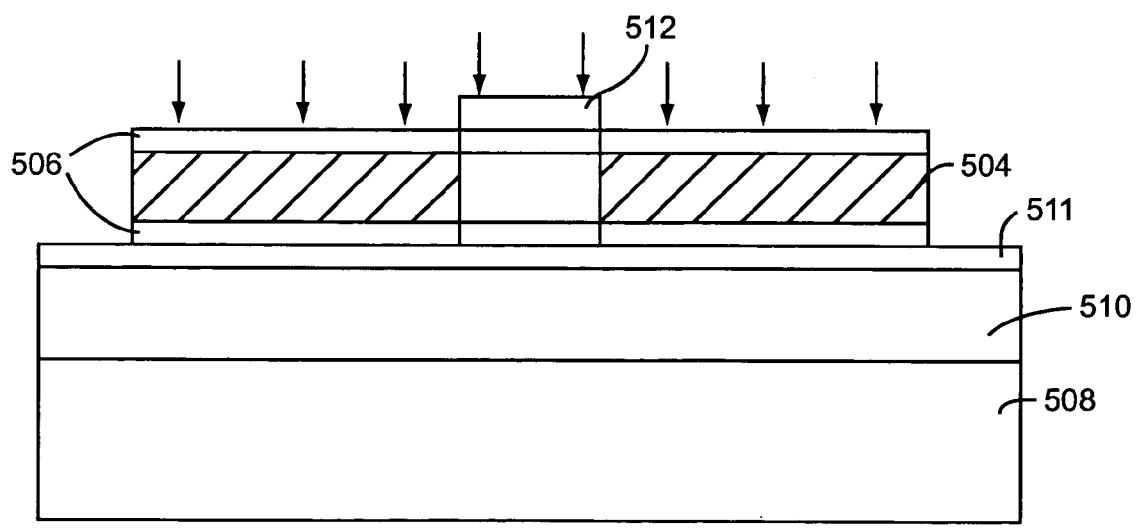
Figure 5F:
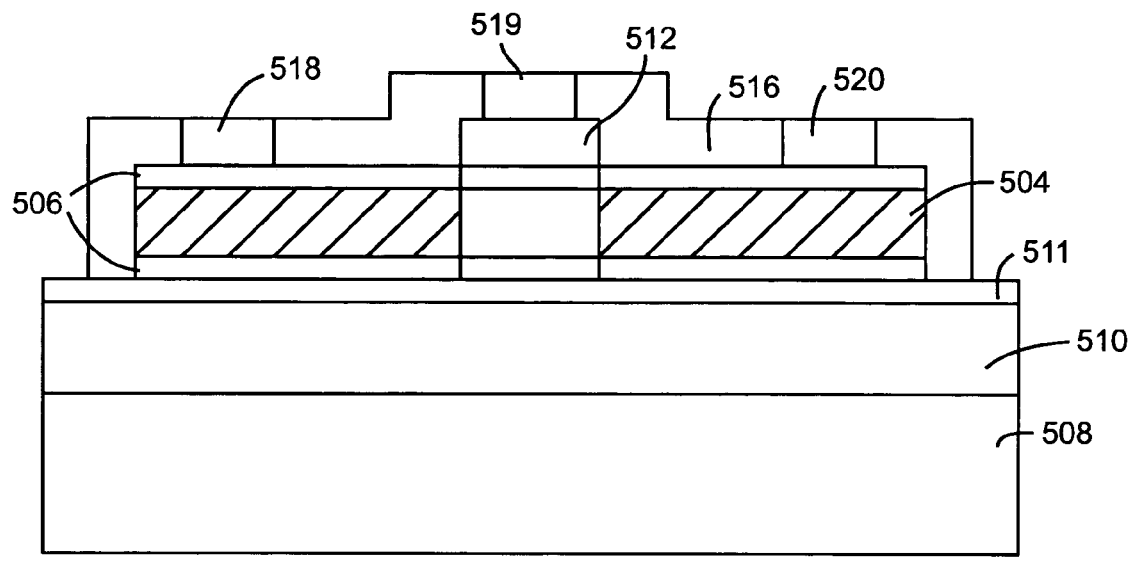

Next, with reference to FIG. 5D, using standard photolithography techniques, a gate mask (not shown) can be used to mask selected regions of the nanowire(s) 504, followed by deposition of a gate material 512 (e.g., a-Si) in the exposed regions. Using the PIII process, the nanowires 504 can then be doped by a plasma, such as a p-type dopant such as $BF_3$ plasma in a helium (He) carrier gas (or an n-type dopant such as phosphine ($PH_3$)), e.g., as shown in FIG. 5E (where the downward directed arrows indicate plasma ion implantation energy). For example, a PIII bias voltage below 5 kV can be used, with an implantation time of less than 10 seconds. The plasma density and bias waveform are tailored such that capacitive coupling across the plasma sheath will pick up most of the applied bias (rather than the substrates). This can be accomplished by adjusting the pulse duration (e.g., duty factor) and/or plasma pressure to modify sheath thickness.

The nanowires 504 of thin film of nanowires can be doped in various ways to improve performance. Although the nanowires 504 are shown herein as being doped on device substrate 508, the nanowires can also be doped prior to deposition on the substrate. Such single crystal nanowires 504 can be doped into either p- or n-type semiconductors. A nanowire 504 can be doped differently along portions of its long axis, and can be doped differently from other nanowires in the thin film of nanowires. A nanowire 504 can be a uniformly doped single crystal nanowire, or doped according to a core-shell structure to include a doped surface layer, which can have varying thickness levels, including being only a molecular monolayer on the surface of nanowire 504. Such surface doping can separate impurities from a conducting channel of the nanowire, and suppress an impurity-related scattering event, and thus may lead to greatly enhanced carrier mobility. For example, when nanowires are doped according to the core-shell structure, "ballistic" transport may be achieved inside the nanowires. "Ballistic" transport is where electrical carriers are transported through a nanowire with essentially no resistance.

Next, the pulsed laser annealing process described herein using a pulsed laser having a laser fluence of less than about 100 mJ/cm², e.g., less than about 50 mJ/cm², e.g., between about 2 and 18 mJ/cm², can be used for solid-phase recrystallization and dopant activation in the source and drain region of the nanowire(s) 504. The laser annealing can be performed, for example, using a Nd:YAG or Nd:YLF laser having wavelengths greater than about 400 nm, e.g., greater than about 500 nm, or by using shorter wavelength lasers such as excimer lasers (e.g., a KrF laser commercially available from Lambda Physik, Inc., Fort Lauderdale, Fla.) at lower wavelengths (e.g., around 248 nm). Collections of nanowires manufactured with these materials are useful building blocks for high performance electronics. A collection of nanowires orientated in substantially the same direction will have a high mobility value. For example a thin film of nanowires used in a semiconductor device can be formed to include 2, 5, 10, 100, and any other number of nanowires between or greater than these amounts, for use in high performance electronics. Note that nanowires can also be used to make high performance composite materials when combined with polymers/materials such as organic semiconductor materials, which can be flexibly spin-cast on any type of substrate. Nanowire/polymer composites can provide properties superior to pure polymer materials.

A thermal oxide/nitride passivation layer 516 (e.g., an oxide such as AlO, a nitride such as SiN, etc.) can then be deposited on the annealed nanowire(s) 504 using standard lithography techniques, and vias 518, 519, and 519 patterned in the passivation layer (e.g., using lithography, photoresist strips, etc.) where it is desired to deposit gate contacts, and source and drain electrical contacts to the nanowires. Note that in the embodiment shown in FIG. 5G, portions of shell layer 506 at the ends of core nanowire 504 can be patterned/removed (e.g., using a buffered oxide etch (BOE) process or other dry etch process) to expose the core of the nanowire so that drain contact 522 and source contact 524 can be in contact with core nanowire 504.

Figure 5G:
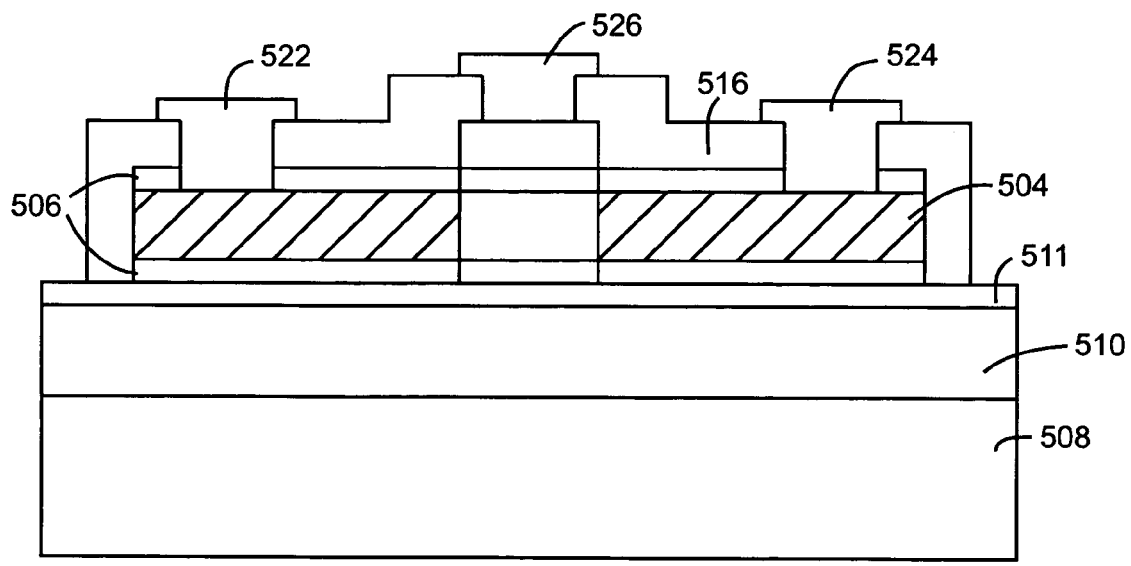

As shown in FIG. 5G, electrical contacts can then be deposited in the source, drain and gate contact regions. Drain contact 522, source contact 524, and gate contact 526 can be any suitable conductive material, including organic (conducting polymers) or inorganic (e.g., a metal or combination of metals/alloy) and can be painted, electroplated, evaporated, sputtered, spun on, or applied as described or reference elsewhere herein, or otherwise known. In embodiments, the nanowires of thin film of nanowires 504 span all the way between source contact 524 and drain contact 522. Hence, electric carriers can transport through the single crystals nanowires, resulting in high mobility which is virtually impossible to obtain with current amorphous and polysilicon technologies.

Figure 6:
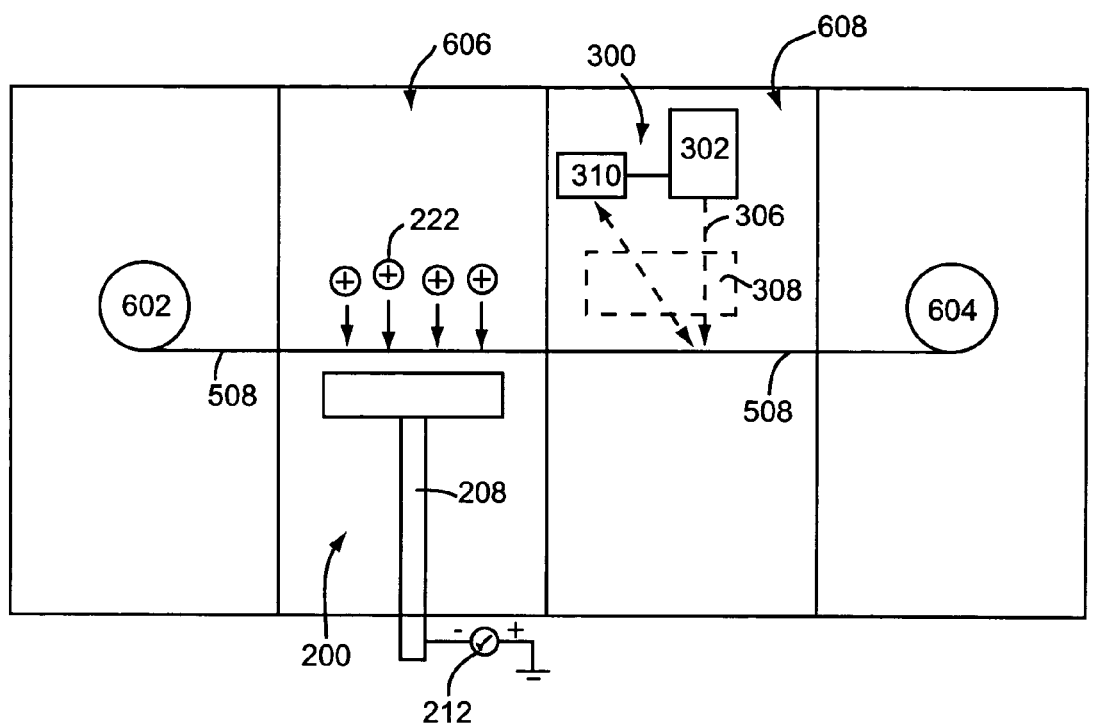
FIG. 6 is a schematic of an embodiment of a roll-to-roll processing system that can be used in practicing the methods of the present invention.

The above process steps can be applied to a variety of substrates, including flexible substrates or rigid substrates, using a variety of deposition techniques such as roll-to-roll processing, ink-jet printing, micro-contact printing and the like. For example, roll-to-roll processing is the process of creating electronic devices on a roll of flexible plastic or metal foil. Large circuits made with thin-film NW TFTs and other devices can be easily patterned onto these large substrates, which can be up to a few meters wide and 50 km long. Some of the devices can be patterned directly, much like an ink jet printer deposits ink. The above PIII and laser annealing process steps described herein can be easily adapted to a roll-to-roll process as shown, for example, in FIG. 6. In FIG. 6, the flexible substrate 508 on which is deposited a thin film of nanowires (not shown) as described previously can be moved in a continuous fashion by the application of rollers 602, 604 through a variety of process chambers such as PIII process chamber 606 and laser annealing process chamber 608, wherein the thin film of nanowires can be doped using a PIII system 200 and annealed using a laser annealing system 300 as described herein Additional process chambers (not shown) can be added in series to those shown to perform various other steps in the NW-TFT fabrication process, including conventional photolithography steps for patterning/depositing gate, source, and drain contacts in the semiconductor devices.

II. Example Applications

The embodiments described herein, when applied to nanowire TFT technology, enable the manufacturing of transistors with performance characteristics comparable or exceeding that of transistors fabricated from traditional single-crystal silicon on very large flexible substrates. This enables ultra-large scale, high-density electrical integration, and provides a true silicon-on-plastic technology. The potential applications of this technology, including military applications, are very broad and include the development of a variety of unique applications, including RF communications, sensor arrays, X-ray imagers, radiofrequency identification tags, flexible or rigid displays, phased array antennas, electronics and more.

For example, incorporating nanowire TFTs into Large Area Electronic Reflectors (LAER) enables the electronically morphing of "any" surface into a parabolic antenna for directed high gain RF transmission or reception. This is similar to making a rooftop physically shaped to optimally protect a house from water while the electronic shape of the roof top would operate as a very large satellite dish. Convex shapes could be made to be electronically concave and thus increase the efficiency of the transceivers, thus reducing the power required to operate them or increase their life or range. Furthermore, the bladder of an airship (such as a blimp) can be made to operate as a very large morphing antenna aperture. Such an airship is a low cost solution for launching a high altitude electronic surveillance/communicator. Embedded TFTs that operate in RF frequencies on the surface of an airship bladder reduce the weight and increase the performance of the air ship.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed:

1. A method for annealing at least one nanowire on a specimen, wherein the at least one nanowire comprises a core and at least one shell layer disposed about the core, the method comprising irradiating portions of the at least one nanowire on the specimen with at least a first laser having a laser fluence of less than about 100 mJ/cm².

2. The method of claim 1, wherein said laser comprises a pulsed laser.

3. The method of claim 2, wherein said pulsed laser comprises an excimer laser.

4. The method of claim 1, wherein said laser has a laser fluence of between about 6 and 14 mJ/cm².

5. The method of claim 1, wherein said laser has a laser fluence of less than about 16 mJ/cm².

6. The method of claim 1, wherein the laser emits light of a wavelength that is not substantially absorbed by the specimen.

7. The method of claim 1, wherein said laser emits light in the visible light range.

8. The method of claim 7, wherein said laser emits light at a wavelength greater than about 500 nm.

9. The method of claim 1, comprising using plasma immersion ion implantation to implant dopant ions into the at least one nanowire prior to said irradiating.

10. The method of claim 1, further comprising irradiating said portions of said at least one nanowire with at least a second laser.

11. The method of claim 10, wherein said second laser comprises an Ar laser.

12. The method of claim 10, wherein said first laser causes nucleation of a semiconductor material of the nanowire, and said second laser maintains a temperature of the nanowire to continue crystal growth of the semiconductor material.

13. The method of claim 1, wherein said at least one nanowire is incorporated within a thin film of nanowires which is deposited on the specimen.

14. The method of claim 1, wherein the specimen is substantially transparent to the annealing laser.

15. The method of claim 1, wherein the at least one shell layer comprises a native or deposited oxide layer.

16. The method of claim 1, wherein portions of the at least one shell layer are removed at source and drain contact regions to the at least one nanowire core.

17. A method for annealing at least one nanowire on a specimen, the method comprising irradiating portions of the at least one nanowire on the specimen with at least a first laser having a laser fluence of less than about 100 mJ/cm$^2$,
wherein said irradiating comprises irradiating along an entire length of the at least one nanowire.

18. A method for annealing at least one nanowire on a specimen, the method comprising irradiating portions of the at least one nanowire on the specimen with at least a first laser having a laser fluence of less than about 100 mJ/cm$^2$,
wherein said laser comprises a pulsed laser that comprises a Nd:YLF (neodymium: yttrium lithium fluoride) laser or a Nd:YAG (neodymium: yttrium aluminum garnate) laser.

19. A method for annealing at least one nanowire on a specimen, the method comprising irradiating portions of the at least one nanowire on the specimen with at least a first laser having a laser fluence of less than about 100 mJ/cm$^2$, wherein said laser has a laser fluence of between about 2 and 18 mJ/cm$^2$.

20. A method for annealing at least one nanowire on a specimen, the method comprising irradiating portions of the at least one nanowire on the specimen with at least a first laser having a laser fluence of less than about 100 mJ/cm$^2$,
wherein said portions of said at least one nanowire comprise doped source and drain regions.

21. The method of claim 20, wherein said portions of said at least one nanowire further comprise one or more gate regions.

22. A method for annealing at least one nanowire on a specimen, the method comprising irradiating portions of the at least one nanowire on the specimen with at least a first laser having a laser fluence of less than about 100 mJ/cm$^2$, wherein said annealing is used as part of a dopant activation process in fabricating a semiconductor device.

23. The method of claim 22, wherein said device comprises a transistor, a diode or a resistor.

24. A method for annealing at least one nanowire on a specimen, the method comprising irradiating portions of the at least one nanowire on the specimen with at least a first laser having a laser fluence of less than about 100 mJ/cm$^2$, wherein the specimen comprises a plastic substrate.

25. A method for annealing at least one nanowire on a specimen, the method comprising irradiating portions of the at least one nanowire on the specimen with at least a first laser having a laser fluence of less than about 100 mJ/cm$^2$, wherein the specimen comprises a flexible substrate.

26. A method for annealing at least one nanowire on a specimen, comprising emitting a laser beam at regions of the at least one nanowire to cause annealing of the regions, wherein the laser beam has a wavelength in the visible light range and wherein said regions of said at least one nanowire comprise doped source and drain regions.

27. The method of claim 26, further comprising pulsing the laser beam.

28. The method of claim 26, wherein said laser beam is emitted from a laser source selected from the group comprising a Nd:YLF (neodymium: yttrium lithium fluoride) laser source or a Nd:YAG (neodymium: yttrium aluminum garnate) laser source.

29. The method of claim 26, wherein said laser beam has a fluence of less than about 16 mJ/cm$^2$.

30. The method of claim 26, comprising using plasma immersion ion implantation to implant dopant ions into the at least one nanowire prior to said annealing.

31. The method of claim 26, wherein the specimen is substantially transparent to the annealing laser.

32. A method for annealing at least one nanowire on a specimen, comprising emitting a laser beam at regions of the at least one nanowire to cause annealing of the regions, wherein the laser beam has a wavelength in the visible light range, and wherein said laser beam has a fluence of between about 2 and 18 mJ/cm$^2$.

33. A method for annealing at least one nanowire on a specimen, comprising emitting a laser beam at regions of the at least one nanowire to cause annealing of the regions, wherein the laser beam has a wavelength in the visible light range, and wherein said annealing is used as part of a dopant activation process in fabricating a semiconductor device.

34. A method for annealing at least one nanowire on a specimen, comprising emitting a laser beam at regions of the at least one nanowire to cause annealing of the regions, wherein the laser beam has a wavelength in the visible light range, and wherein said specimen comprises a transistor, a diode or a resistor.

35. A method for annealing at least one nanowire on a specimen, comprising emitting a laser beam at regions of the at least one nanowire to cause annealing of the regions, wherein the laser beam has a wavelength in the visible light range, and wherein said at least one nanowire comprises a core and at least one shell layer disposed about the core.

36. The method of claim 35, wherein the at least one shell layer comprises a native or deposited oxide layer.

37. The method of claim 35, wherein portions of the at least one shell layer are removed at source and drain contact regions to the at least one nanowire core.

38. A method of making a field effect transistor on an active device area of a device substrate, comprising:
(a) depositing on a device substrate at least one nanowire;
(b) implanting dopant ions into at least source and drain regions of the at least one nanowire to form source and drain contact junctions; and (c) performing a laser thermal anneal with a pulsed laser having a fluence of less than about 100 mJ/cm2 to activate said dopant ions within said source and drain contact junctions.

39. The method of claim 38, wherein said pulsed laser is selected from the group comprising a Nd:YLF (neodymium: yttrium lithium fluoride) laser, a Nd:YAG (neodymium: yttrium aluminum garnate) laser, or an excimer laser.

40. The method of claim 38, wherein said pulsed laser has a fluence of between about 2 and 18 mJ/cm$^2$.

41. The method of claim 38, wherein said pulsed laser has a fluence of between about 6 and 14 mJ/cm$^2$.

42. The method of claim 38, wherein said pulsed laser has a fluence of less than about 16 mJ/cm$^2$.

43. The method of claim 38, wherein said pulsed laser emits light in the visible light range.

44. The method of claim 38, wherein said implanting comprises using plasma immersion ion implantation to implant said dopant ions.

* * * * *